United States Patent
Lo et al.

(10) Patent No.: US 10,909,290 B2
(45) Date of Patent: Feb. 2, 2021

(54) METHOD OF DETECTING A CIRCUIT MALFUNCTION AND RELATED DEVICE

(71) Applicant: Realtek Semiconductor Corp., HsinChu (TW)

(72) Inventors: I-Hsiu Lo, Hsinchu County (TW); Yung-Jen Chen, Hsinchu County (TW); Yu-Lan Lo, Hsinchu County (TW); Shu-Yi Kao, Hsinchu County (TW)

(73) Assignee: Realtek Semiconductor Corp., HsinChu (TW)

( * ) Notice: Subject to any disclaimer, the term of this patent is extended or adjusted under 35 U.S.C. 154(b) by 0 days.

(21) Appl. No.: 16/808,324

(22) Filed: Mar. 3, 2020

(65) Prior Publication Data

US 2020/0320241 A1    Oct. 8, 2020

(30) Foreign Application Priority Data

Apr. 8, 2019 (TW) .............................. 108112082 A

(51) Int. Cl.
 *G06F 17/50* (2006.01)
 *G06F 30/3323* (2020.01)
 *G06F 30/3308* (2020.01)
 *G06F 30/398* (2020.01)

(52) U.S. Cl.
 CPC ...... *G06F 30/3323* (2020.01); *G06F 30/3308* (2020.01); *G06F 30/398* (2020.01)

(58) Field of Classification Search
 CPC . G06F 30/3323; G06F 30/3308; G06F 30/398
 USPC ............................ 716/106, 112, 136; 703/16
 See application file for complete search history.

(56) References Cited

U.S. PATENT DOCUMENTS

| | | | |
|---|---|---|---|
| 7,849,428 B2 | 12/2010 | Barowski | |
| 8,099,703 B1 | 1/2012 | Manovit | |
| 2014/0317584 A1 | 10/2014 | Busch | |
| 2020/0265123 A1* | 8/2020 | Dan | .................... G06F 30/3308 |

OTHER PUBLICATIONS

Wile et al., "Comprehensive Functional Verification: The Complete Industry Cycle", Morgan Kaufmann Publishers, 2005, 702 pages. (Year: 2005).*

* cited by examiner

*Primary Examiner* — Phallaka Kik
(74) *Attorney, Agent, or Firm* — Winston Hsu

(57) ABSTRACT

A method of detecting a circuit malfunction in a register transfer level, RTL, design stage is disclosed. The method comprises obtaining signal points of each register from a circuit model based on the RTL design stage, generating a property list according to the signal points of each register, wherein the property list includes a property to be verified for each signal point, performing a formal verification operation according to the circuit model and the property list, to determine whether the property of the property list for each signal point in the circuit model is true, and generating a circuit malfunction result according to the signal point whose property is not true.

8 Claims, 4 Drawing Sheets

Register

Clock signal without
switching capability

Reset signal without
switching capability

Output signal without
switching capability

METHOD OF DETECTING A CIRCUIT MALFUNCTION AND RELATED DEVICE

BACKGROUND OF THE INVENTION

1. Field of the Invention

The present invention relates to a method of detecting circuit malfunction, and more particularly, to a method of detecting integrated circuit malfunction in register transfer level design stage with formal verification and related device.

2. Description of the Prior Art

Integrated circuit, IC, is performed of logic design via register transfer level, RTL, to describe IC with hardware language, such as Verilog-HDL. After RTL design stage, it takes a complex design flow to finalize the circuit. If a RTL design error is found in the circuit finalization, namely circuit malfunction, the designer must go back and modify the RTL design, and then re-run the design flow, or the designer tries to understand the circuit structure and make direct modifications with high difficulty (commonly called Engineering Change Order, ECO). However, in either case, a lot of resources are wasted (e.g. re-design time and loss of funds).

The conventional way to ensure the correctness of RTL design is mainly based on simulation and lint check. In a word, the simulating test is to hypothesize a behavior of the circuit in a specific scenario, then use the software to simulate the RTL design to obtain the actual circuit behavior of the scene, and finally compare it with the hypothesized behavior to verify the correctness of design. However, this approach cannot obtain complete circuit behavior, and the reliability is decreased as the circuit complexity and the application scenario increase. On the other hand, the lint check can detect potential circuit malfunction, such as input floating, wiring width mismatch, and so on. Though lint check does not require predictive results and is highly reliable, it is limited to syntax determination, and thus it is impossible to detect an IC design with syntax correct, but actually in design error.

SUMMARY OF THE INVENTION

It is therefore an objective to provide a method of detecting circuit malfunction in register transfer level design stage and related device to solve the above problem.

The present invention discloses a method of detecting a circuit malfunction in a register transfer level, RTL, design stage. The method comprises obtaining signal points of each register from a circuit model of the RTL design stage, generating a property list based on the signal points of each register, wherein the property list includes a property to be verified for each signal point, performing a formal verification operation according to the circuit model and the property list, to determine whether the property of the property list for each signal point in the circuit model is true, and generating a circuit malfunction result according to the signal point whose property is not true.

The present invention further discloses an electronic device, for circuit malfunction detection for a register transfer level, RTL, design stage. The electronic device comprises a register extracting unit, for obtaining signal points of each register from a circuit model of the RTL design stage, a property verification generating unit, for generating a property list based on the signal points of each register, wherein the property list includes a property to be verified for each signal point, a formal calculation unit, for performing a formal verification operation according to the circuit model and the property list, and generating a signal list including at least a signal point whose property is not true, and a circuit malfunction determination unit, for generating a circuit malfunction result according to the signal list, to modify the circuit model.

The present invention further discloses an electronic device, for circuit malfunction detection for a register transfer level, RTL, design stage. The electronic device comprises a processing unit, for executing a program code, and a storage unit, coupled to the processing unit, for storing the program code, wherein the program code instructs the processing unit to perform the following steps: obtaining signal points of each register from a circuit model of the RTL design stage, generating a property list based on the signal points of each register, wherein the property list includes a property to be verified for each signal point, performing a formal verification operation according to the circuit model and the property list, to determine whether the property of the property list for each signal point in the circuit model is true, and determining that a register has a circuit malfunction when a property of a signal point of the register is not true.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
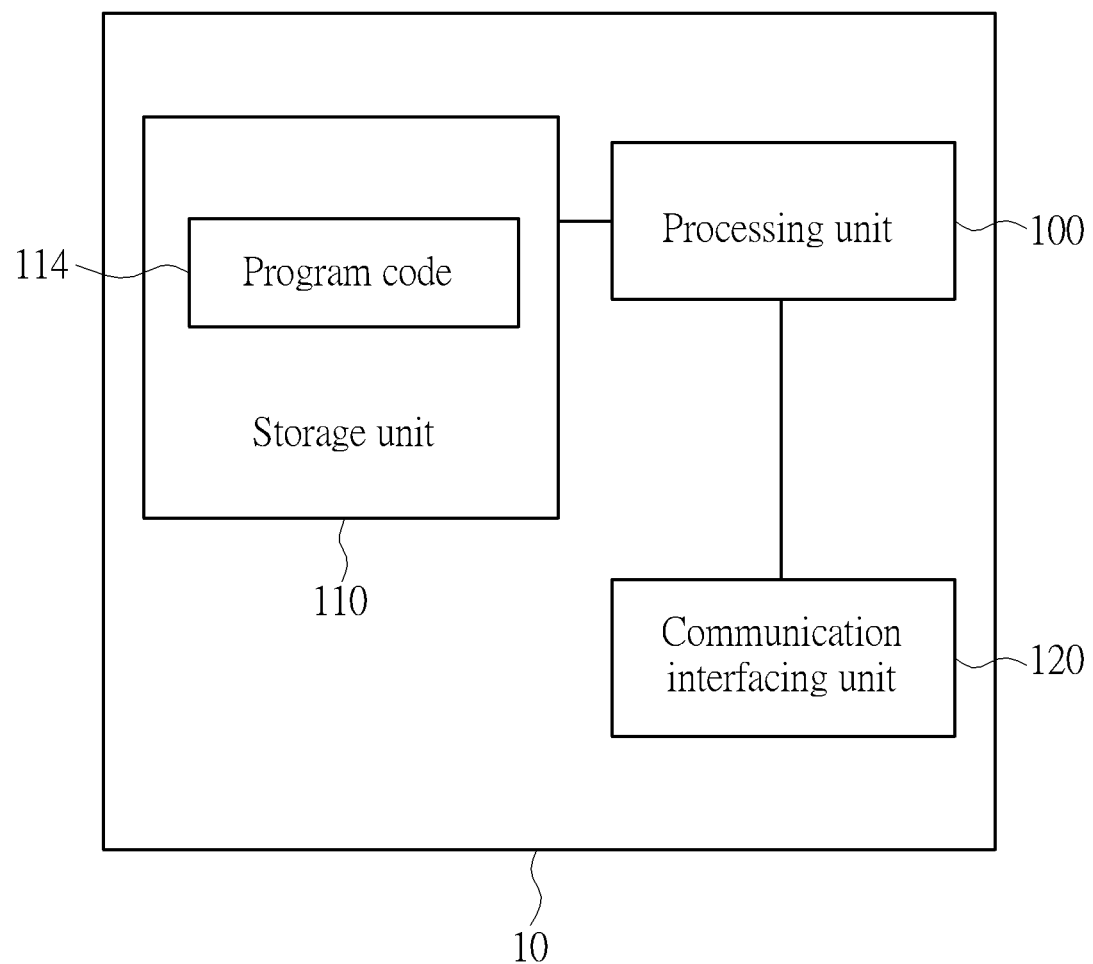
FIG. 1 is a schematic diagram of an electronic device according to an embodiment of the present disclosure.

FIG. 1 is a schematic diagram of the electronic device 10 according to one embodiment of the present disclosure. The electronic device 10 is used for detecting circuit malfunction and includes a processing unit 100, such as a microprocessor or Application Specific Integrated Circuit (ASIC), a storage unit 110 and a communication interfacing unit 120. The storage unit 110 may be any data storage device that can store a program code 114, for access by the processing unit 100. The communication interfacing unit 120 could receive circuit model in register transfer level (RTL) design stage from other electronic devices (e.g. computer system) with wired or wireless way. In other embodiments, the circuit model in the RTL design stage could be stored in the storage unit 110 and read by the processing unit 100 from the storage unit 110.

Figure 2:
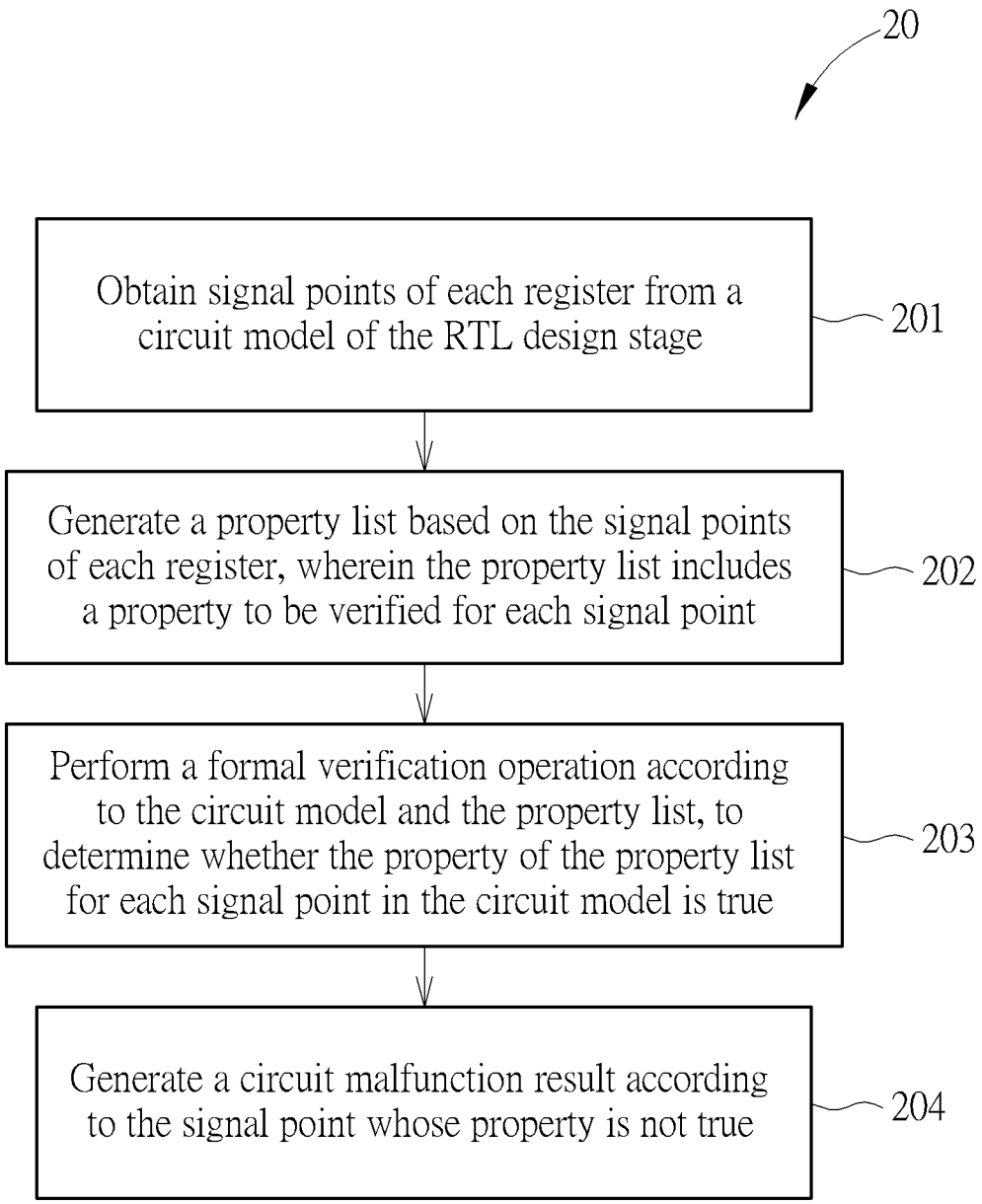
FIG. 2 is a flowchart of circuit malfunction detection according to an embodiment of the present disclosure.

Reference is made to FIG. 2. A flowchart of circuit malfunction detection process 20 is illustrated. The circuit malfunction detection process 40 could be utilized in the electronic device 10 of FIG. 1, may be compiled into a program code 114, and may include the following steps:

Step 201: Obtain signal points of each register from a circuit model of the RTL design stage.

Step 202: Generate a property list based on the signal points of each register, wherein the property list includes a property to be verified for each signal point.

Step 203: Perform a formal verification operation according to the circuit model and the property list, to determine whether the property of the list for each signal point in the circuit model is true.

Step 204: Generate a circuit malfunction result according to the signal point whose property is not true.

According to circuit malfunction detection process 20, the electronic device 10 extracts all registers from the circuit model of RTL design, to obtain every signal point of each register. In addition, the electronic device 10 generates property list for formal verification, wherein the property list includes property or attribute (i.e. switching capability condition) of each signal point of the register. The electronic device examines the signal point without switching capability or all signal points of the register when the electronic device 10 determines the property of the signal point of the register is not true (namely the signal point including no switching capability) by the formal verification, to generate circuit malfunction result, so as to modify the circuit model in the RTL design stage. Thus, with circuit malfunction detection process 20, re-design time and cost for the circuit could be reduced.

Note that, the formal method is a verification operation in the computer system, which could be called formal verification. The core of the formal verification is model-checking, or property-checking. When the formal verification is applied to verify the circuit model, the input is the entire system of the circuit model and the properties of the signal points of the registers to be verified, so as to determine whether the property is necessarily true in the system, or may be a counterexample. Since the formal method is based on rigorous mathematical proof, the reliability is high. It has been applied to web server operations, flight software verification, railway system design, etc. The most well-known application for the integrated circuit is the Logic Equivalence Check. The formal method should be well known to those skilled in the art and therefore is omitted herein. The present invention is addressed to provide a process for detecting the RTL design circuit.

Figure 3:
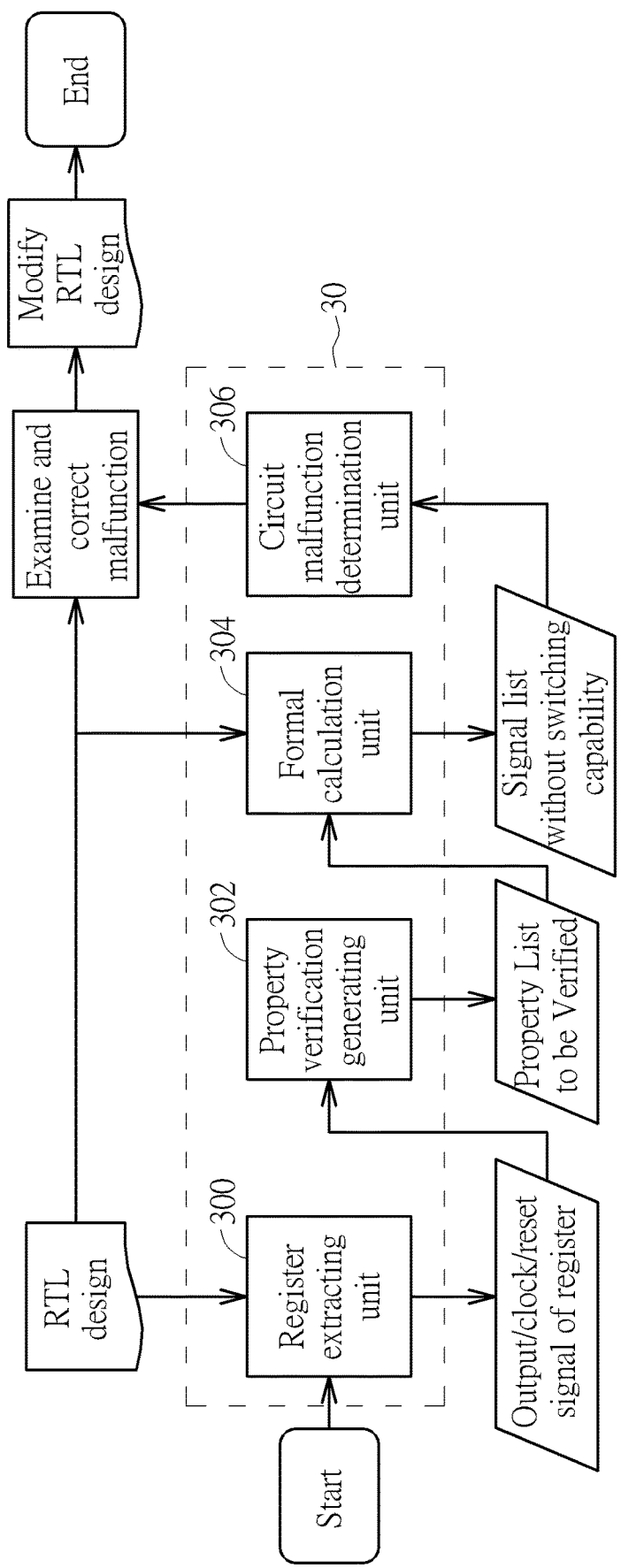
FIG. 3 is a schematic diagram of a circuit malfunction detecting operation according to an embodiment of the present disclosure.

FIG. 3 is a schematic diagram of a circuit malfunction detecting operation according to an embodiment of the present disclosure. The circuit malfunction detecting operation is applied to circuit detecting device 30, which includes register extracting unit 300, property verification generating unit 302, formal calculation unit 304 and circuit malfunction determination unit 306. Since the RTL design syntax may not directly declare the register on the hardware, but announces signals in the form of the register, these signals may be represented combinatorial logic circuits or real register on the hardware. The register extracting unit 300 processes the entire RTL design with a parser, monitors the signals declared in the form of the register, and specifies how the signals of the design are assigned, to determine whether the signal is corresponding to the real hardware register, whereby each signal points, such as clock/reset/output/input, of every register is obtained. The property verification generating unit 302 converts the condition of the switching capability for the clock/reset/output/input of the register into the verification attribute for the following formal method. In other words, the property verification generating unit 302 takes signal points (namely the clock/reset/output/input) of the register as an input, and generates the property list including the switching capability for each signal point. Next, the formal calculation unit 304 takes the property list generated by the property verification generating unit 302 and the RTL design as an input, to perform property verification, thereby determining whether the property of the clock/reset/output/input is true on the circuit. In other words, when the formal calculation unit 304 determines that the property of a certain signal point is not true, it means that the signal includes no switching capability, and therefore the formal calculation unit 304 generates a signal list without the switching capability. On the other hand, when the formal calculation unit 304 determines that the property of a certain signal point is true, it means that the signal is provided with the switching capability. Finally, the circuit malfunction determination unit 306 determines that the register corresponding to the signal without the switching capability cannot function normally or is unnecessary according to the signal list without the switching capability. In addition, the circuit malfunction determination unit 306 generates an inference circuit malfunction report according to the signal list without the switching capability, so that the RTL designer can re-consider the design and perform corresponding correction accordingly, to avoid circuit malfunction occurrence.

Figure 4A:
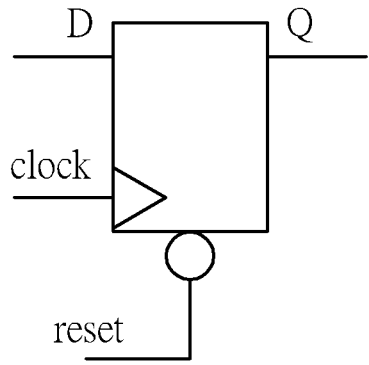
FIG. 4A is a schematic diagram of signal points of a register according to an embodiment of the present disclosure.

Briefly, the present invention provides a method and related device for detecting a circuit malfunction at the early stage of the RTL design, which can be detected by observing the signal points without switching capability. In an embodiment, the clock signal/reset signal/output signal Q/input signal D (as shown in FIG. 4A) of the register is used as an observation point, and the switching capability for the observation point is obtained by the formal method. Thus, the electronic device 10 or the circuit detecting device 30 of the present invention can enumerate the cause of the malfunction of the register according to the observation point or signal without the switching capability.

Figure 4B:
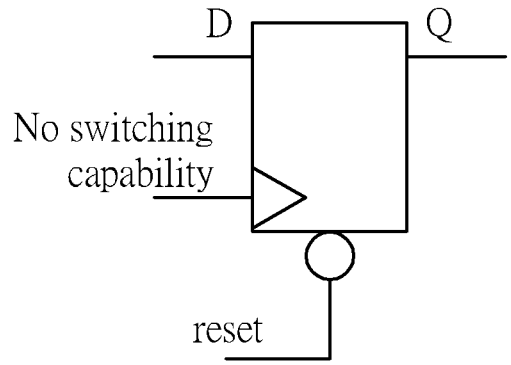
FIGS. 4B-4D are schematic diagrams of signal points without switching capability for circuit malfunction hypothesis according to an embodiment of the present disclosure.
Figure 4C:
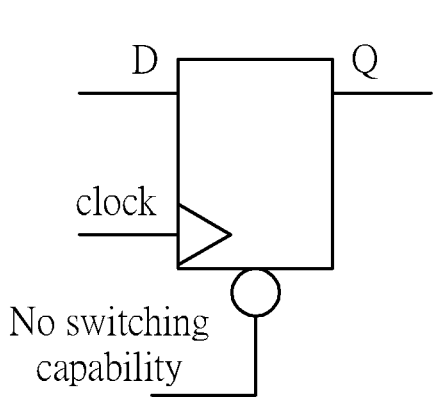
Figure 4D:
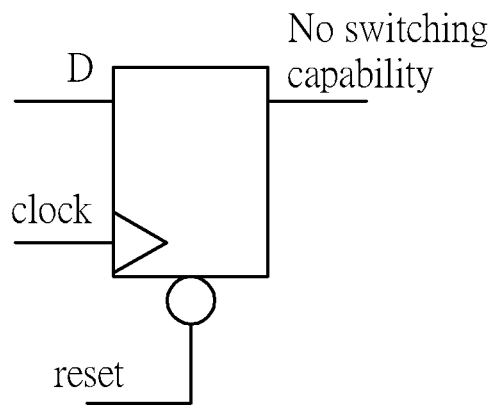

Please refer to FIGS. 4B-4D, which illustrates the clock signal clock signal/reset signal/output signal Q of the register without the switching capability (i.e. the corresponding property is not true). In FIG. 4B, the value of the input signal D can never be triggered by the clock signal to send to the output signal Q when the clock signal provides no switching capability, so that the output signal Q remains or stuck in the same reset value after the reset signal is released. In FIG. 4C, when the reset signal provides no switching capability, the situation is divided into the following two types. If the reset signal is always at reset state, the output signal Q is always stuck in the reset value of the register. On the other hand, if it is always not at reset state, the register loses its ability to reset. In FIG. 4D, when the output signal Q provides no switching capability, this register is not necessary at all in the RTL design, which means that this register can be replaced with a constant output component to save area and power consumption. This kind of malfunction may come from the clock signal, the reset signal or the value of the input signal D is always unchanged. The value of the input signal D is the result of the input logic cone of the register. The reason of that the value of the input signal D remain the same may be that the logic operation of the register is redundant, or it may be common for the circuit under certain configurations. Note that, the abovementioned malfunction result from the signals without switching capability can be derived by unit 306, so that the RTL designer can quickly view and correct the circuit model of the RTL design.

As abovementioned, the clock signal/reset signal/output signal Q without switching capability may occur at the same time, or may separately occur upon the register. For example, when the clock signal and the reset signal without switching capability occur at the same time, the output signal Q cannot be switched due to the clock signal, cannot be inputted the value sent by the input signal D, and remains at reset value or cannot be reset because the reset signal cannot be activated. As a result, the combination of no switching capability may cause various unwanted register behavior.

Based on the abovementioned malfunction, the designer usually needs to modify the RTL design to eliminate it, but in practice, it cannot be ruled out that the RTL designers are on purpose or not. In FIG. 4C, the register loses the ability to reset when the reset signal is never in the reset state. In general, the reset function is necessary for most registers, but sometimes due to certain considerations, a register without reset function is required. Thus, the designer has to review and adjust the RTL design to avoid misidentify. Or in order to reuse the RTL sub-block on different circuits, the designer may make some signals in floating state intentionally to fulfill the requirement of the checking in design flow. Under this circumstance, the designer has to avoid the circuit being implemented different from the expected.

The abovementioned steps of the processes including suggested steps can be realized by means that could be a hardware, a firmware known as a combination of a hardware device and computer instructions and data that reside as read-only software on the hardware device or an electronic system. Examples of hardware can include analog, digital and mixed circuits known as microcircuit, microchip, or silicon chip. Examples of the electronic system can include a system on chip (SOC), system in package (SiP), a computer on module (COM) and the electronic device 10 or circuit detecting device 30.

In conclusion, the present invention provides a method of detecting circuit malfunction, which adopts a formal method with rigorous mathematical proof to detect specific malfunction in whole when the digital integrated circuit is in the RTL design stage. In other words, the circuit malfunction detection of the present invention is not limited to a specific scenario. In detail, the present invention utilizes the formal method to derive signal points for which the property is not true or no switching capability, so as to obtain the register malfunction result for modifying the RTL design. In contrast, the conventional simulation method is limited in some scenarios, so that malfunctions may occur and react in the circuit behavior. However, this method is almost impossible to reveal all malfunctions in acceptable time cost. In addition, with syntax check, the conventional commercial software provides the function of tracking the connection of signals, but due to the nature of syntax check, it is impossible to detect all malfunctions.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of detecting a circuit malfunction in a register transfer level, RTL, design stage, the method comprising:
    obtaining signal points of each register from a circuit model of the RTL design stage;
    generating a property list based on the signal points of each register, wherein the property list includes a property to be verified for each signal point;
    performing a formal verification operation according to the circuit model and the property list, to determine whether the property of the property list for each signal point in the circuit model is true; and
    generating a circuit malfunction result according to the signal point whose property is not true.

2. The method of claim 1, wherein the property comprises a switching capability of a signal point, and the property list comprises the switching capability of a clock signal point, a reset signal point, an output signal point and an input signal point of a register.

3. The method of claim 2, further comprising:
    determining that the at least one of the clock signal point, the reset signal point, the output signal point and the input signal point does not have the switching capability when the property of the at least one of the clock signal point, the reset signal point, the output signal point and the input signal point is not true.

4. The method of claim 3, wherein the step of generating the circuit malfunction result according to the signal point whose property is not true comprising:
    performing an examining operation for every signal points of a register when any signal point of the register does not have the switching capability, to generate the circuit malfunction result.

5. The method of claim 2, further comprising:
    determining that a signal point does not have the switching capability when the property of the signal point is not true;
    generating a signal list including signal points without the switching capability; and
    generating the circuit malfunction result according to the signal list, to modify the circuit model.

6. An electronic device, for circuit malfunction detection for a register transfer level, RTL, design stage, the electronic device comprising:
    a register extracting unit, for obtaining signal points of each register from a circuit model of the RTL design stage;
    a property verification generating unit, for generating a property list based on the signal points of each register, wherein the property list includes a property to be verified for each signal point;
    a formal calculation unit, for performing a formal verification operation according to the circuit model and the property list, and generating a signal list including at least a signal point whose property is not true; and
    a circuit malfunction determination unit, for generating a circuit malfunction result according to the signal list, to modify the circuit model.

7. The electronic device of claim 6, wherein the circuit malfunction determination unit is further used for determining that the signal point of the signal list does not have a switching capability, and performing an examining operation for every signal points of a register when any signal point of the register does not have the switching capability, to generate the circuit malfunction result.

8. An electronic device, for circuit malfunction detection for a register transfer level, RTL, design stage, the electronic device comprising:
    a processing unit, for executing a program code; and
    a storage unit, coupled to the processing unit, for storing the program code, wherein the program code instructs the processing unit to perform the following steps:

obtaining signal points of each register from a circuit model of the RTL design stage;

generating a property list based on the signal points of each register, wherein the property list includes a property to be verified for each signal point;

performing a formal verification operation according to the circuit model and the property list, to determine whether the property of the property list for each signal point in the circuit model is true; and determining that a register has a circuit malfunction when a property of a signal point of the register is not true.

* * * * *